United States Patent [19]

Silva

[11] Patent Number: 4,481,674

[45] Date of Patent: Nov. 6, 1984

[54] SLEEP SWITCH VOLUME CONTROL

[76] Inventor: Wayne A. Silva, 97 Park St., New Bedford, Mass. 02740

[21] Appl. No.: 393,773

[22] Filed: Jun. 30, 1982

[51] Int. Cl.³ .......................... H04B 1/08; H04B 1/16
[52] U.S. Cl. ................................... 455/231; 368/245; 455/232
[58] Field of Search ............... 455/230, 231, 232, 219; 381/107, 109, 123; 368/98, 245; 340/309.15

[56] References Cited

U.S. PATENT DOCUMENTS

| | | | |
|---|---|---|---|
| 2,491,968 | 12/1949 | Gilbert | 455/230 |
| 3,356,949 | 12/1967 | Jones, Jr. | 455/231 |
| 3,569,839 | 3/1971 | Dyer | 455/231 |
| 3,873,921 | 3/1975 | Petrinec | 455/231 |

*Primary Examiner*—Marc E. Bookbinder

[57] ABSTRACT

This invention is directed at a sleep switch volume control wherein the body portion of a clock radio timer knob has conductive and insulative portions which may be formed on two transverse, circumferential sections. The two sections are in abutting, parallel relation to each other. The conductive portions and insulative portions of the two sections are off-set from each other and are selectively electrically connected to an electrical circuit as the knob is rotated.

A variation of the sleep switch volume control utilizes two transverse uninsulated sections which are electrically insulated from each other and which are located circumferentially on the body portion of the timer knob. The uninsulated sections are selectively electrically connected to an electrical circuit as the timer knob of the radio rotates.

7 Claims, 9 Drawing Figures

SLEEP SWITCH VOLUME CONTROL

BACKGROUND OF THE INVENTION

All the clock radios known to the present inventor utilize a single volume control for both the wake up mode and the sleep mode. When the radio is used prior to the user's falling asleep, low volume is preferred, but when the radio is used to wake the user up, high or moderately high volume is desired. Presently available clock radios will permit only a single volume setting which is either too high in the sleep cycle or too low in the wake up cycle.

SUMMARY OF THE INVENTION

The improved clock radio according to the present invention is characterized by the fact that a separate volume control is utilized to by-pass the original volume control during the sleep cycle when the radio is playing prior to the user falling asleep; therefore, a low volume can be set for the sleep cycle and a louder volume can be set for wake up.

The improved radio utilizes the rotation of the clock timer knob to activate the separate volume control during the time the radio has been set to play. The timer knob has its external surface covered with a conductive material which is divided into two sections that in turn are divided into two portions one of which is bare and the other of which is covered with insulation. Each of the sections electrically engages one of two wires making and breaking electrically connections with the two volume controls.

A variation of the improved radio utilizes two transverse sections both of which are uninsulated but which are insulated from each other. A single conductor wire is adapted to first engage one transverse section to activate a seperate volume control which remains operational during the period that the timer knob is rotating. When the timer knob stops rotating the conductor wire is engaged to the other transverse section reactivating the regular volume control and deactivating the seperate volume control.

BRIEF DESCRIPTION OF THE DRAWINGS

Further details are explained below with the help of the example illustrated in the attached drawings in which.

DESCRIPTION OF THE PREFERRED EMBODIMENT

Figure 1:
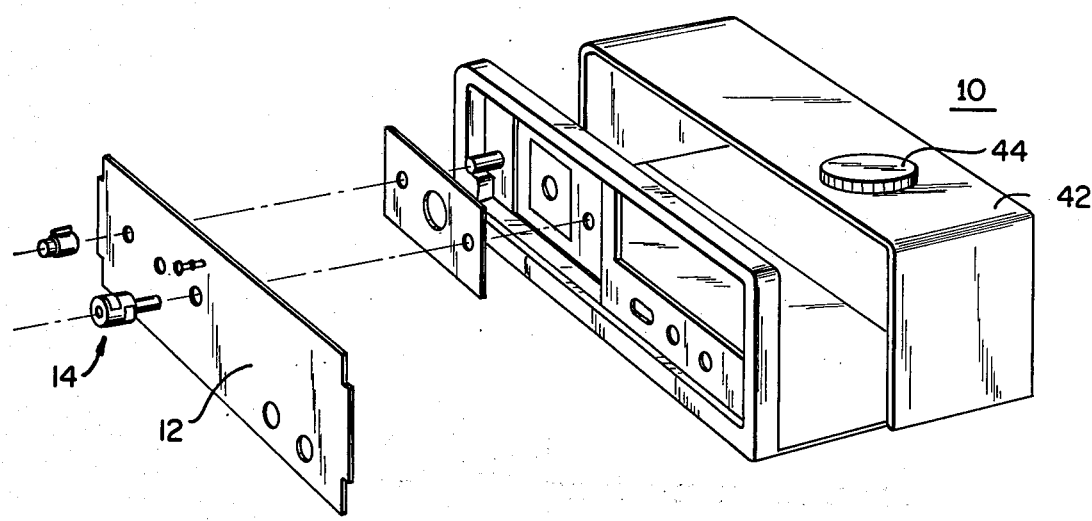
FIG. 1 is an exploded, external view of the clock radio according to the present invention.
Figure 2:
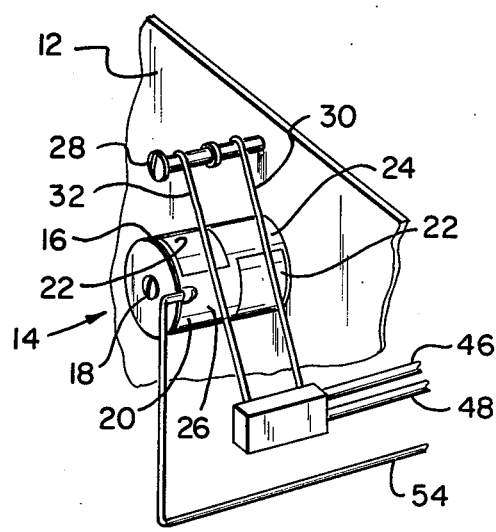
FIG. 2 is an enlarged view of the clock timer knob according to the present invention.
Figure 3:
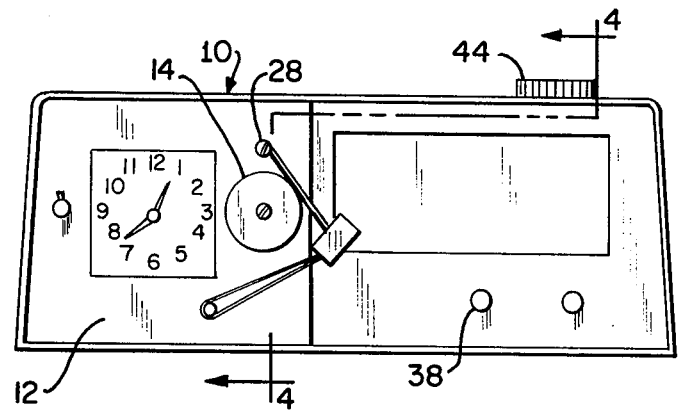
FIG. 3 is a front elevational view of the clock radio according to the present invention.
Figure 4:
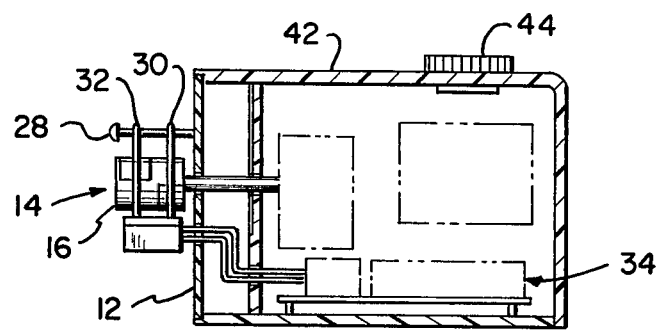
FIG. 4 is a sectional view taken on line 4—4 of FIG. 3.
Figure 5:
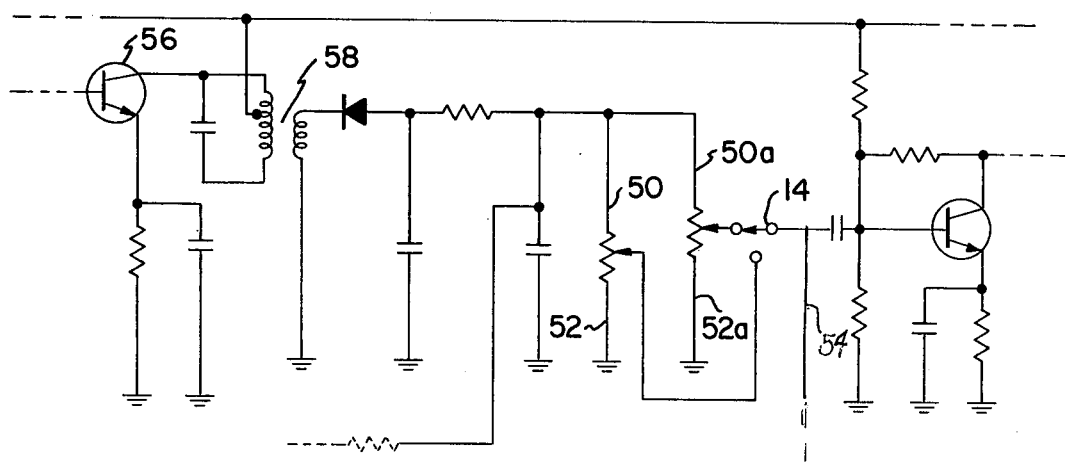
FIG. 5 is a schematic diagram of the electrical circuit according to the present invention.
Figure 6:
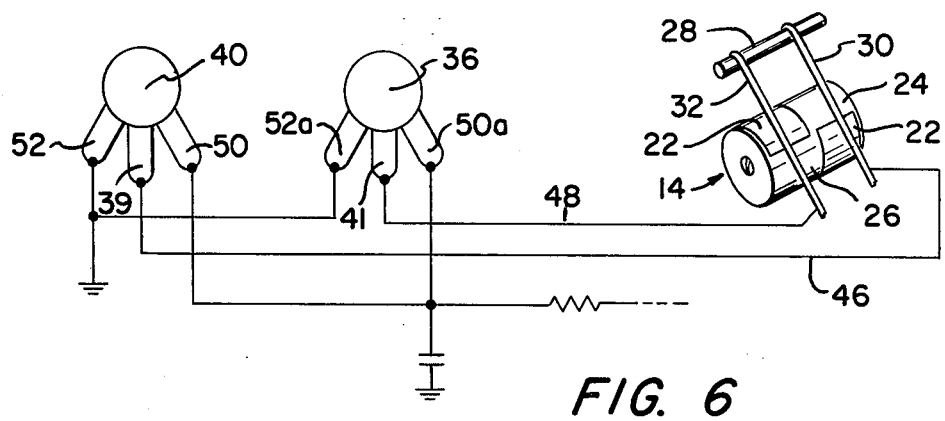
FIG. 6 is a pictorial view of the two variable resistors and the clock timer knob and a schematic diagram of the electrical circuit associated therewith.

There is shown in the drawing a clock radio 10, for example, the AM Clock Radio Cat. No. 12-1460 manufactured for Radio Shack, a division of Tandy Corporation. The clock radio 10 includes a front panel having tuning and volume knobs extending therefrom and having a front panel 12 mounted thereon. A knob controlling the off-on switch and the alarm is mounted spaced from one side of a clock face, positioned on the front panel 12, and a timer knob 14 is mounted spaced from the other side of the clock face as shown in FIG. 1. The timer knob 14 comprises a drum like body portion 16 having a screw 18 extending axially and rearwardly therefrom. The screw 18 engages a pulley and pulley shaft which, in turn, is connected to the clock mechanism. An electrically conductive, metal strip 20 is wrapped around and attached to the circumferential, external surface of the body portion 16. The external surface of the metal strip 20 is partially covered with insulation material 22 leaving a rear circumferential section 24 and a front circumferential section 26 both bare of insulation, as shown in FIG. 2. A post 28, formed from electrically insulating material, extends from the front panel 12 above the timer knob 14 in spaced parallel relation to the screw 18. A first wire 30 has one of its terminal ends wrapped around the post 28 and a second wire 32 also has one of its terminal ends wrapped around the post 28. The portions of the first and second wires 30, 32 wrapped around the post 28 are electrically insulated from each other by positioning an insulator barrier, a piece of insulating tape for example, between them. The other terminal ends of the first wire 30 and of the second wire 32 are electrically connected to the electrical system 34 of the radio 10 as will be more fully set forth hereinafter. The first wire 30 is positioned to electrically engage the bare rear circumferential section 24 of the metal strip 20 as the timer knob 14 is rotated, by a drive means, in a counterclockwise direction for a predetermined number of degrees. During this rotation the first wire 30 maintains physical and electrical contact with the bare rear circumferential section 24. Simultaneously, the second wire 32 rides on the insulation material 22 adjacent the bare rear circumferential section 24, as shown in FIG. 2. After the timer knob 14 has rotated counterclockwise the predetermined number of degrees, the second wire 32 physically and electrically engages the bare front circumferential section 26. At the same time the first wire 30 is positioned on the insulation material 22 adjacent the bare front circumferential section 26.

As is the usual case, the volume control of the clock radio 10 is accomplished through a primary variable resistor 36 that is manually adjusted, by rotating the volume control knob 38, to provide the desired listening output level from the speaker. The inventor has mounted a secondary variable resistor 40 on the inside surface of the radio cabinet top 42 which is manually controlled by a second volume control knob 44 that extends from the external surface of the radio cabinet top 42.

The first wire 30 is electrically connected to a first lead 46 which, in turn, is connected to the central terminal 39 of the secondary variable resistor 40. The second wire 32 is electrically connected to a second lead 48 which in turn is connected to a middle terminal 41 of the primary variable resistor 36. The first side terminal 50 of the secondary variable resistor 40 is connected to the first side terminal 50a of the primary variable resistor 36 and the second side terminal 52 of the secondary variable resistor 40 is connected to the second side terminal 52a of the primary variable resistor 36. These connections electrically position the secondary variable resistor 40 in parallel relation to the primary variable resistor 36. A third wire 54 physically and electrically connects the metal strip 20, which circumscribes the body portion 16 of the timer knob 14, to the amplifier circuit of the radio 10. The connection, in prior art devices, is made between the middle terminal of the primary variable resistor 36 and the amplifier circuit of the radio 10. The first side terminal 50a of the primary variable resistor 36 is connected to source (i.e. the line leading from the circuit beyond the transistor 56 and the transformer 58) and its second side terminal 52a goes to ground.

The new device is used to permit independent control of what may be termed the "normal" volume and "sleep control" volume. In prior art designs "normal" volume is controlled by the volume control knob 38 and, in the disclosed device, operates when the sleep switch timer knob 14 is inactive. "Sleep control" volume is controlled by the same volume control knob in prior art devices, but in the disclosed device a second volume control knob 44 operates when the sleep switch timer knob 14 is active(i. e. is rotating). To operate the device the sleep control timer knob 14 is rotated clockwise a desired number of degrees, at which time the radio is playing. The desired volume is obtained by manipulating the second volume control knob 44. The timer knob 14 is rotated by a drive mechanism, not shown, in a counterclockwise direction with the first wire 30 physically and electrically contacting the metal strip 20 through the bare rear circumferential section 24. The secondary variable resistor 40 controls the volume of the radio 10 until the timer knob 14 completes its timing cycle at which time the electrical connection of the secondary variable resistor is cut off from the metal strip 20 and the primary variable resistor 36 is electrically connected to the metal strip 20. At this time volume control is returned to the volume control knob 38.

Figure 7:
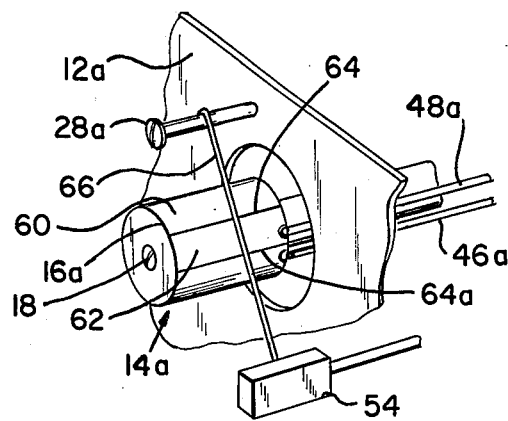
FIG. 7 is an enlarged view of a clock timer knob of a variation of a clock timer knob shown in FIGS. 1-6.
Figure 8:
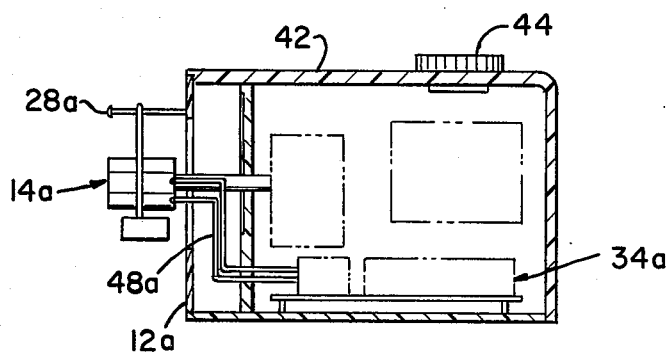
FIG. 8 is a sectional view of a portion of the variation of the clock radio showing a side elevation of the clock timer knob shown in FIG. 7.
Figure 9:
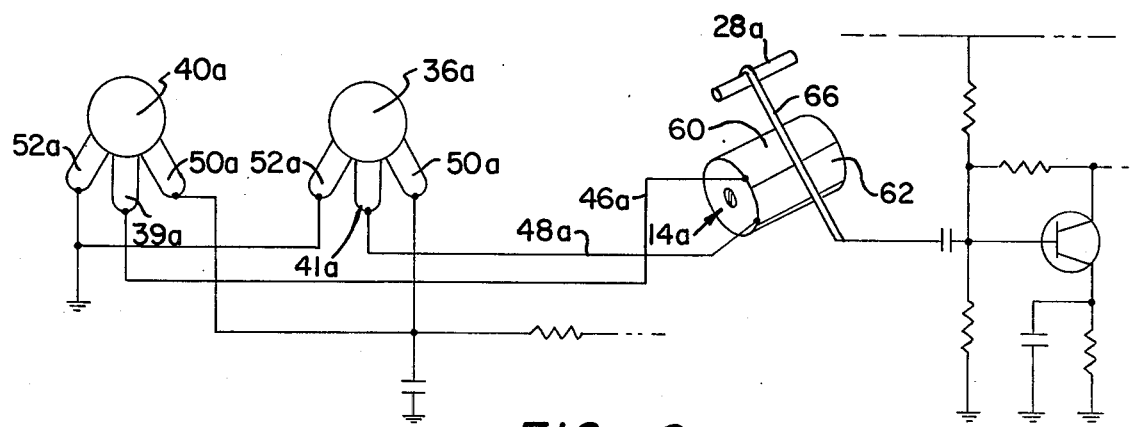
FIG. 9 is a pictorial view of the two variable resistors and the variation of the clock timer knob and a schematic diagram of the electrical circuit associated therewith.

A variation of the timer knob 14 is disclosed in FIGS. 7-9 and is numbered 14a. The timer knob 14a comprises a cylindrical body portion 16a having a screw engaged axially therewith and extending rearwardly to engage a pulley and pulley shaft which, in turn, is connected to a clock mechanism. First and second conductive strips 60,62 are engaged to the external surface of the body portion 16a as shown in FIG. 7. The first conductive strip 60 runs from 0 degrees on the circumferance of the body portion 16a to 328 degrees thereon and the second conductive strip 62 runs from 329 degrees on the circumferance of the body portion 16a to 359 degrees thereon. The first and second conductive strips 60,62 are seperated from each other by first and second insulator strips 64,64a each of which occupies one degree of circumferance. A post 28a, formed from an insulating material, for example, extends from the front panel 12a above and off set from the body portion 16a. The post 28a is in parallel relation to the screw 18a. A conductor wire 66 has one of its terminal ends wrapped around the post 28a and the terminal end connected to the electrical system 34a of the radio 10a as will be more fully set forth herinafter. The central portion of the conductor wire 66 is positioned to engage either the first or second conductive strips 60,62 and the arc of the body portion 16a is such that the conductor wire 66 will not engage both the first and second conductive strips 60,62 simultaneously. The front panel 12a has a circle of material removed from around the area of the body portion 16a for a purpose to be discussed hereinafter. A first lead 46a is attached to and extends from the first conductive strip 60 to the central terminal 39a of the secondary variable resistor 40a. A second lead 48a is attached to and extends from the second conductive strip 62 to the central terminal 41a of the primary variable resistor 36a. The remaining parts of the radio 10a are identical in all respects to the radio 10 described hereinbefore.

The variation is also used to permit independent control of what the inventor has termed the "normal" volume and "sleep control" volume. To operate the variation 10a the sleep control timer knob 14a is rotated clockwise a desired number of degrees, at which time the radio is playing. The desired volume is obtained by manipulating the second volume control knob 44a. The timer knob 14a is rotated by a drive mechanism, not shown, in a counterclockwise direction with the conductor wire 66 physically and electrically contacting the first conductive strip 60. The first and second leads 46a,48a rotate about the shaft engaged by the screw 18a as the body portion 16a rotates. The secondary variable resistor 40a controls the volume of the radio 10a until the timer knob 14a completes its timing cycle and which time the physical and electrical connection of the conductor wire 66 is broken and the connection with the secondary variable resistor 40a is cut off and the conductor wire physically and electrically engages the second conductive strip 62 connecting the primary variable resistor 36a to the electrical system 34a. At this time volume control is returned to the volume control knob 38a.

What I claim is:

1. A clock radio comprising a timer assembly, a primary volume control assembly, a secondary volume control assembly, a support surface and rotation means, the primary volume control assembly including a primary variable resistor and a first volume control knob, the secondary volume control assembly including a secondary variable resistor and a second volume control knob, the timer assembly comprises a rotatable member having a cylindrical body portion and a support member, the rotatable member and the support member extending away from the support surface, the body portion including an external surface having electrically conductive first and second portions formed on two longitudinal, circumferential sections of the body portion, the first and second electrically conductive portions electrically insulated from each other, an electrical conductor extending from the support member, the electrical conductor having a central portion bearing against the second electrically conductive portion and the rotatable member adapted to be rotated through a timing cycle by the rotation means, the primary variable resistor electrically connected to the second conductive portion and the secondary variable resistor electrically connected to the first conductive portion whereby the electrical conductor bears against the first electrically conductive portion during a portion of the timing cycle.

2. A clock radio electrical circuit comprising a radio circuit, a timer assembly, a primary volume control assembly, a secondary volume control assembly, a support surface and rotation means, the primary volume control assembly including a primary variable resistor and a first volume control knob, the secondary volume control assembly including a secondary variable resistor and a second volume control knob, the timer assembly comprising a rotatable member having a cylindrical body portion and a support member, the rotatable member and the support member extending from the support surface, the body portion including an external surface having electrically conductive and insulative portions formed on two circumferential sections of the body portion, the two circumferential sections comprisng a first circumferential section and a second circumferential section, the first and second circumferential sections each including an upper portion and a lower portion, the lower portion of the first circumferential section and the upper portion of the second circumferential section comprising the insulative portions and the upper portion of the first circumferential section and the lower portion of the second circumferential section comprising the conductive portions, first and second electrical conductors extending from the support member in spaced relation to and electrically insulated from each other, the first conductor electrically connected to the secondary variable resistor and having a first terminal portion bearing against the upper portion of the first circumferential section, the second conductor electrically connected to the primary variable resistor and having a second terminal portion bearing against the upper portion of the second circumferential section, the upper portion of the first circumferential section and the lower portion of the second circumferential section electrically connected to the radio circuit and the rotatable member adapted to be rotated through a timing cycle by the rotation means whereby the first terminal portion of the first conductor bears against the lower portion of the first circumferential section and the second terminal portion of the second conductor simultaneously bears against the lower portion of the second circumferential section thereby switching the primary variable resistor in and out of the clock radio electrical circuit.

3. A clock radio as set forth in claim 2 wherein the first conductor is electrically connected to the secondary variable resistor and the second conductor is electrically connected to the primary variable resistor.

4. A clock radio as set forth in claim 2 wherein the rotatable member is a timer knob.

5. A clock radio as set forth in claim 2 wherein the support member comprises a post having a longitudinal axis, the body portion of the rotatable member having a longitudinal axis and the two longitudinal axis in spaced, parallel relation to each other.

6. A clock radio as set forth in claim 2 wherein the electrical conductors are wires and the wires are in spaced parallel relation to each other.

7. A clock radio as set forth in claim 3 wherein the rotatable member is a timer knob, the support member comprises a post having a longitudial axis, the body portion of the rotatable member having a longitudinal axis and the two longitudinal axes in spaced, parallel relation to each other and the electrical conductors are wires and the wires are in spaced, parallel relation to each other.

* * * * *